United States Patent [19]
Osera et al.

[11] Patent Number: 5,767,720
[45] Date of Patent: Jun. 16, 1998

[54] CLOCK SIGNAL SUPPLYING CIRCUIT

[75] Inventors: Shinichi Osera; Yukihiro Saeki, both of Yokohama, Japan

[73] Assignee: Kabushiki Kaisha Toshiba, Kawasaki, Japan

[21] Appl. No.: 686,041

[22] Filed: Jul. 25, 1996

[30] Foreign Application Priority Data

Jul. 26, 1995 [JP] Japan ................... 7-190456

[51] Int. Cl.$^6$ .................................................. H03K 5/13
[52] U.S. Cl. ........................ 327/295; 327/161; 327/292
[58] Field of Search ............................... 327/292, 293, 327/295, 298, 299, 291, 99, 144, 145, 153, 154, 161, 261, 233, 231, 235

[56] References Cited

U.S. PATENT DOCUMENTS

| | | |
|---|---|---|
| 4,965,524 | 10/1990 | Patchen ........................... 327/292 |
| 5,122,679 | 6/1992 | Ishii et al. ....................... 327/147 |
| 5,150,364 | 9/1992 | Negus ............................. 327/295 |
| 5,396,111 | 3/1995 | Frangioso et al. ................. 327/295 |
| 5,444,407 | 8/1995 | Ganapathy et al. ................ 327/295 |
| 5,537,068 | 7/1996 | Konno ............................. 327/175 |

*Primary Examiner*—Timothy P. Callahan
*Assistant Examiner*—Eunja Shin
*Attorney, Agent, or Firm*—Finnegan, Henderson, Farabow, Garrett & Dunner, L.L.P.

[57] ABSTRACT

A clock signal generated by a clock signal generating circuit is supplied to a frequency-dividing circuit formed using a D-type flip-flop circuit, being supplied to a controlled circuit after being divided down. Furthermore, the clock signal generated by the clock signal generating circuit is supplied to the controlled circuit by way of a through circuit having signal-delay-quantity substantially equivalent to signal-delay-quantity of the frequency-dividing circuit, the through circuit being formed using the D-type flip-flop circuit in the same way as the frequency-dividing circuit.

18 Claims, 5 Drawing Sheets

CLOCK SIGNAL SUPPLYING CIRCUIT

BACKGROUND OF THE INVENTION

1. Field of the Invention

The present invention relates to a clock signal supplying circuit formed within a semiconductor integrated circuit, and more particularly to a circuit improving a clock skew between one clock signal passed through a through path (path causing the signal to pass only) and the other clock signal passed through a frequency-dividing path (path including a frequency-dividing circuit), from the same clock signal source, wherein the clock signal supplying circuit is generally used for a power saving circuit or the like.

2. Description of the Related Art

In a semiconductor integrated circuit, a power saving circuit is often used for reducing power consumption. The power saving circuit changes a clock signal so as to supply a clock signal with lower frequency than the normal operation mode when a controlled circuit, whose operation is controlled by an operation-clock signal supplied from a clock signal supplying circuit, is waiting-operation mode.

Figure 1:
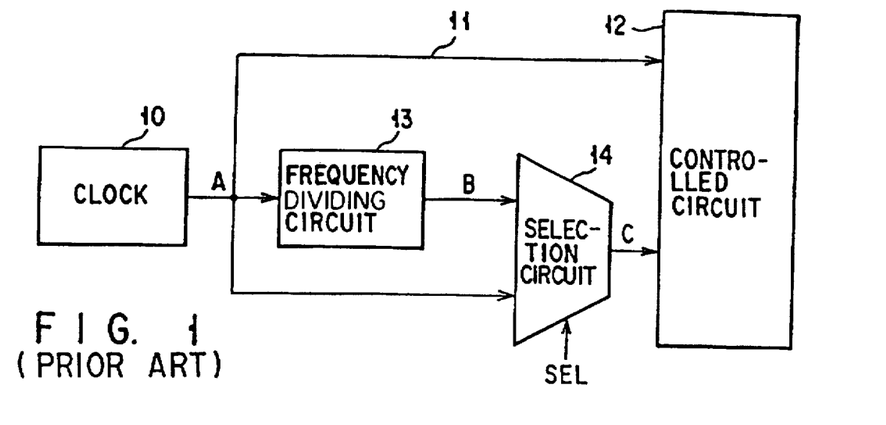
FIG. 1 is a circuit diagram showing a conventional example of a clock signal supplying circuit.

The clock signal supplying circuit selectively supplies plural kinds of clock signal group with different frequencies to the controlled circuit based on the clock signal from the same clock signal source, and a conventional clock signal supplying circuit is formed for example as shown in FIG. 1.

In FIG. 1, a clock signal A generated at a clock signal generating circuit 10 is supplied to a controlled circuit 12 while directly passing through a signal path 11. Furthermore, the clock signal A is divided into a half of it in a frequency-dividing circuit 13. A selection circuit 14 selects either the clock signal A or an output signal (divided frequency clock signal) B in accordance with a selection signal SEL. A selected output C from the selection circuit 14 is supplied to the controlled circuit 12.

Figure 2:
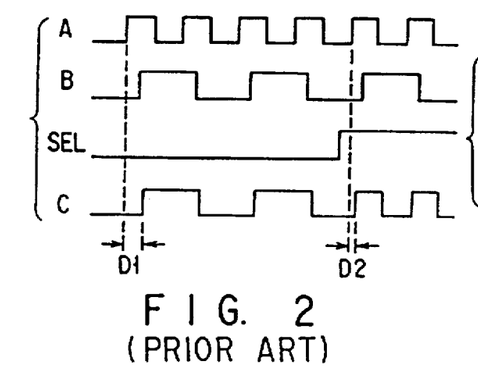
FIG. 2 is a timing-wave-form chart showing one operational example of the conventional circuit of FIG. 1.

However in the above described structure, a clock skew is generated between two rising edges of the clock signals each of which is passed through different path respectively. Namely, for example, as shown in FIG. 2, when the clock signal B is selected according to the selection signal SEL, the clock signal passed through the frequency-dividing circuit 13 and the selection circuit 14 and supplied to the controlled circuit 12 is delayed only for a delayed period of D1 caused by the frequency-dividing circuit 13 and the selection circuit 14 than the clock signal A which is directly supplied to the controlled circuit 12 from the signal path 11.

Furthermore, when the clock signal A is selected according to the selection signal SEL from the clock signal generating circuit 10, the clock signal passed through the selection circuit 14 and supplied to the controlled circuit 12 is delayed only for a delayed period of D2 caused by the selection circuit 14 than the clock signal A directly supplied to the controlled circuit 12 from the signal path 11.

When the above described clock skew is generated, omission of data occurs for example in the built-in shift register within the controlled circuit 12, speed of the circuit-operation drops, or malfunction occurs at the interface among the circuits.

Under these circumstances, in order to improve the clock skew generated between clock signals with different signal paths, it is conceivable to put a delay-dummy circuit composed of inverter circuit and capacity within the signal path 11. However in this case, due to a dispersion of manufacturing process and fluctuation of threshold for MOS transistor forming an inverter circuit and so forth, it is hard to sufficiently avoid the clock skew.

As described above, in the conventional clock signal supplying circuit, there have been much problems that clock skew is generated between clock signal passed through the path in which the signal is only passed through and divided frequency clock signal passed through the path which includes the divided frequency circuit, from the same clock signal source.

SUMMARY OF THE INVENTION

In view of the foregoing, it is an object of the present invention to provide a clock signal supplying circuit in which a clock skew between a clock signal passed through a path for only allowing the signal from a clock signal source to pass and a divided frequency clock signal from the same clock signal source passed through a path including a frequency-dividing circuit, thereby making a great improvement.

According to one aspect of the present invention, there is provided a clock signal supplying circuit which comprises a clock signal generating circuit for generating a clock signal, a first signal path in which a frequency-dividing circuit for dividing down the clock signal, a second signal path having signal-delay-quantity substantially equivalent to signal-delay-quantity of the first signal path, and causing the clock signal to pass through, and a controlled circuit which receives both a signal of the first signal path and a signal of the second signal path, an operation thereof being controlled by the signals.

According to another aspect of the present invention, there is provided a clock signal supplying circuit which comprises a clock signal generating circuit for generating a clock signal, a frequency-dividing circuit which receives the clock signal, and outputs a first signal with the clock signal divided down, a delay circuit having signal-delay-quantity substantially equivalent to signal-delay-quantity between input signal and output signal of the frequency-dividing circuit, and outputting a second signal after receiving the clock signal, and a controlled circuit which receives both the first signal outputted from the frequency-dividing circuit and the second signal outputted from the delay circuit, an operation thereof being controlled by the first and the second signals.

According to further aspect of the present invention, there is provided a clock signal supplying circuit which comprises a clock signal generating circuit for generating a clock signal, a first frequency-dividing circuit which receives the clock signal, and outputs a first signal with the clock signal divided down, a first delay circuit having signal-delay-quantity substantially equivalent to signal-delay-quantity between input signal and output signal of the first frequency-dividing circuit, and outputting a second signal after receiving the clock signal, a first selection circuit in which either the first signal outputted from the first frequency-dividing circuit or the second signal outputted from the first delay circuit is selected in accordance with a selection control signal, and the selected signal is outputted as a third signal, a second delay circuit having signal-delay-quantity substantially equivalent to signal-delay-quantity between the clock signal and the output of the first selection circuit, and outputting a fourth signal after receiving the clock signal, and a controlled circuit which receives both of the third signal outputted from the first selection circuit and the fourth signal outputted from the second delay circuit, an operation thereof being controlled by the third and the fourth signals.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

A preferred embodiment of the present invention will now be described in detail referring to the accompanying drawings.

Figure 3:
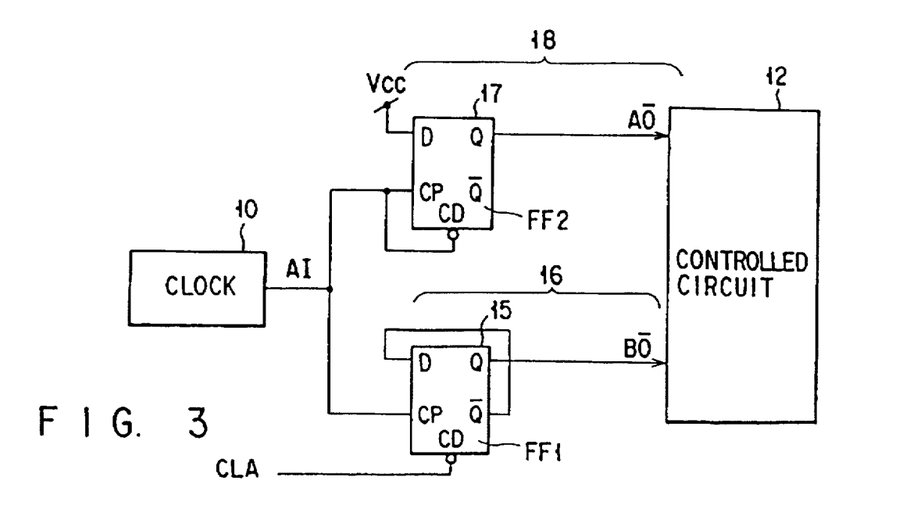
FIG. 3 is a circuit diagram of a clock signal supplying circuit according to the first embodiment of the present invention.

FIG. 3 shows a structure of the first embodiment of a clock signal supplying circuit of the present invention.

The clock signal supplying circuit shown in FIG. 3 comprises a clock signal generating circuit 10, a frequency-dividing path 16 for supplying a divided frequency clock signal BO to a controlled-circuit 12, in which a clock signal AI outputted from the above clock signal generating circuit 10 is divided by a frequency-dividing circuit 15 (for example dividing-by-two frequency-dividing circuit) using a D-type flip-flop circuit FF1, and a passing path 18 for supplying a clock signal AO to the controlled-circuit 12, in which a clock signal AI outputted from the above clock signal generating circuit 10 is not divided but is passed through a through circuit 17 (delay circuit) including a D-type flip-flop circuit FF2 with an equivalent internal structure to the above frequency-dividing circuit 15 and having the same signal-delay-quantity D11 as the signal-delay-quantity D11 of the above frequency-dividing circuit 15.

Figure 4:
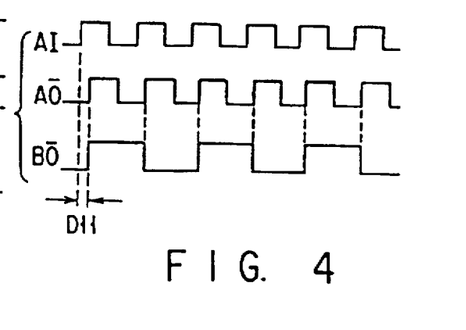
FIG. 4 is a timing-wave-form chart showing one operational example of the clock signal supplying circuit according to the first embodiment of FIG. 3.

As shown in FIG. 4, in the above structure of the clock signal supplying circuit, each of the two clock signals BO, AO through either the frequency-dividing path 16 or the passing path 18 from the same clock signal source is supplied together to the controlled-circuit 12. Under these circumstances, the through circuit 17 having the signal-delay-quantity D11 which is equivalent to that of the frequency-dividing circuit 15 existing halfway the frequency-dividing path 16 is inserted halfway the passing way 18.

This makes it possible to greatly improve the clock skew between the divided frequency clock signal BO through the frequency-dividing path 16 and the clock signal AO through the passing path 18 both of which are generated from the same clock signal source.

Furthermore, the frequency-dividing circuit 15 comprises a clock input terminal CP, a data input terminal D, a data output terminal Q, an inversion-data-output terminal /Q, a clear signal terminal CD, in which the clock signal AI is inputted to the clock input terminal CP, and the D-type flip-flop circuit FF1 to which the inversion-data-output terminal/Q (/Q is the complementary signal of Q) and the data input terminal D are connected. Moreover, the D-type flip-flop circuit the internal structure of which is equivalent to that of the frequency-dividing circuit 15 is used in the through circuit 17 (delay circuit), the clock signal AI is inputted both to the clock input terminal CP and the clear signal terminal CD, a power supply voltage Vcc with positive value namely "H"-level logic signal is inputted to the data input terminal D.

Figure 5:
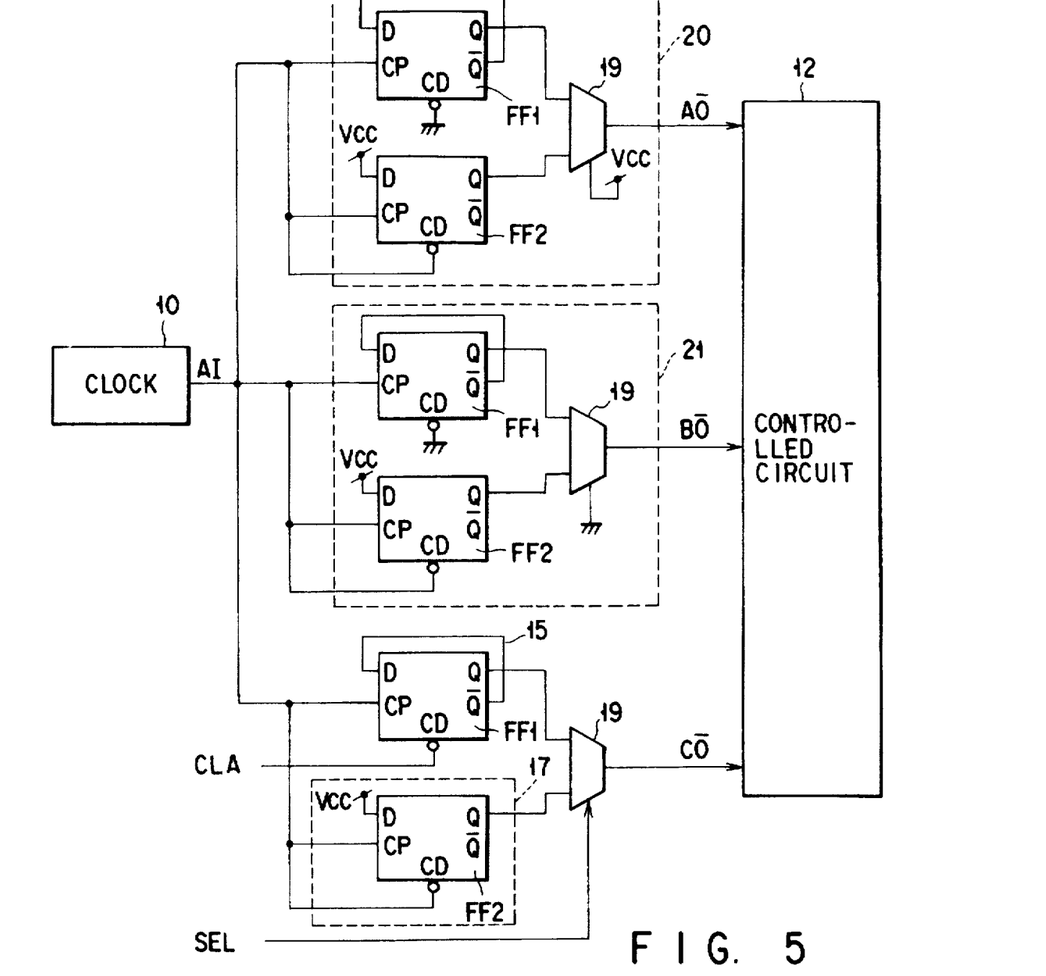
FIG. 5 is a circuit diagram showing a clock signal supplying circuit according to the second embodiment of the present invention.

FIG. 5 shows a structure according to the second embodiment of the clock signal supplying circuit of the present invention.

The clock signal supplying circuit shown in FIG. 5 comprises a frequency-dividing circuit 15 (for example dividing-by-two frequency-dividing circuit) in which the D-type flip-flop circuit FF1 dividing down the clock signal A1 outputted from the clock signal generating circuit 10 is used, a first through circuit 17 including the D-type flip-flop circuit FF2 which is the same as the frequency-dividing circuit 15 causes the clock signal input A1 to pass except for the dividing thereof and having a signal-delay-quantity which is substantially equivalent to the signal-delay-quantity of the frequency-dividing circuit 15, a first selection circuit 19 for selecting both of the divided frequency clock signal from the frequency-dividing circuit 15 and the clock signal from the first through circuit 17 based on the selection signal SEL, and for supplying a selected output CO to the controlled-circuit 12, a second through circuit 20 for supplying the clock signal AO which is passed through except for dividing the clock signal A1 to the controlled-circuit 12, and the second through circuit 20 having signal-delay-quantity which is equivalent to the signal-delay-quantity from the clock signal generating circuit 10 to the output side of the first selection circuit 19, and a third through circuit 21 for supplying a divided frequency clock signal BO which is obtained in such a way that a clock signal AI outputted from the clock signal generating circuit 10 is divided down, and the third through circuit 21 having a signal-delay-quantity which is the same as the signal-delay-quantity from the clock signal generating circuit 10 to the output side of the first selection circuit 19.

The second through circuit 20 and the third through circuit 21 are comprised the D-type flip-flop circuit FF1 with the clear signal terminal CD as with the frequency-dividing circuit 15 respectively, which is composed of the D-type flip-flop circuit FF1 with the earth clear signal terminal CD, the D-type flip-flop circuit FF2 as with the first through circuit 17, and the selection circuit 19 with the same structure as the selection circuit 19.

Further, the power supply voltage Vcc as the selection signal SEL namely the "H"-level logic signal is supplied to the selection circuit 19 within the second through circuit 20, and the selection circuit 19 regularly selects the output of the D-type flip-flop circuit FF2. While a ground potential as the selection signal SEL namely "L"-level logic signal is supplied to the selection circuit 19 within the third through circuit 21, and the selection circuit 19 regularly selects the output of the D-type flip-flop circuit FF1.

Figure 6:
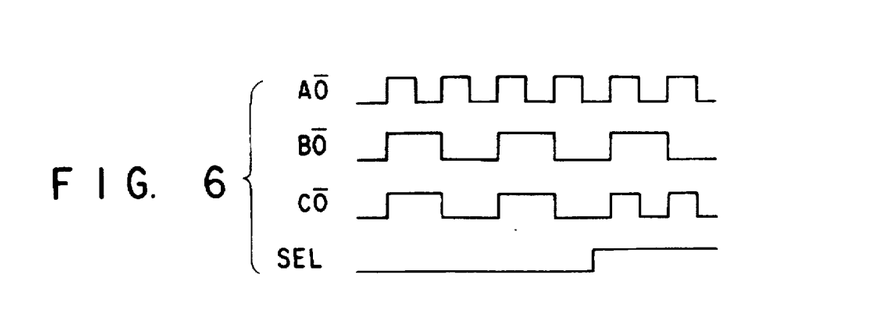
FIG. 6 is a timing-wave-form chart showing one operational example the clock signal supplying circuit according to the second embodiment of FIG. 5.

The clock signal supplying circuit with the structure of FIG. 5 operates that it causes the corresponding three clock signals through the first to the third signal paths from the same clock signal source to supply to the controlled-circuit 12, as shown in FIG. 6. Under these circumstances, the first through circuit 17 having signal-delay-quantity equivalent to the signal-delay-quantity of the frequency-dividing circuit in the different signal path branched in regard to the signal path with the frequency-dividing circuit 15 is inserted into the first signal path for obtaining the clock signal CO, while the second through circuit 20 and the third through circuit 21 which have signal-delay-quantity equivalent to the signal-delay-quantity of the first signal path from the clock signal generating circuit to the output side of the selection circuit 19 are inserted into the second signal path and the third signal path respectively.

This makes it possible to greatly improve clock skew among the three clock signals passed through the different path from the same clock signal source.

Furthermore, in this embodiment, the output of the D-type flip-flop circuit FF2 is regularly selected at the selection circuit 19 within the second through circuit 20, since the output of the D-type flip-flop circuit FF1 is not selected at all, the D-type flip-flop circuit FF1 is also capable of being omitted. Under the circumstances, when the D-type flip-flop circuit FF1 is omitted, in order to prevent a malfunction of the selection circuit 19, the input terminal which is of the floating of the selection circuit 19 is fixed to the "H"-level or "L"-level. Similarly, the output of the D-type flip-flop circuit FF1 is regularly selected at the selection circuit 19 within the third through circuit 21, since the output of the D-type flip-flop circuit FF2 is not selected at all, the D-type flip-flop circuit FF2 is also capable of being omitted. Also under the circumstances, the input terminal which is of the floating is fixed to the "H"-level or "L"-level.

Figure 7:
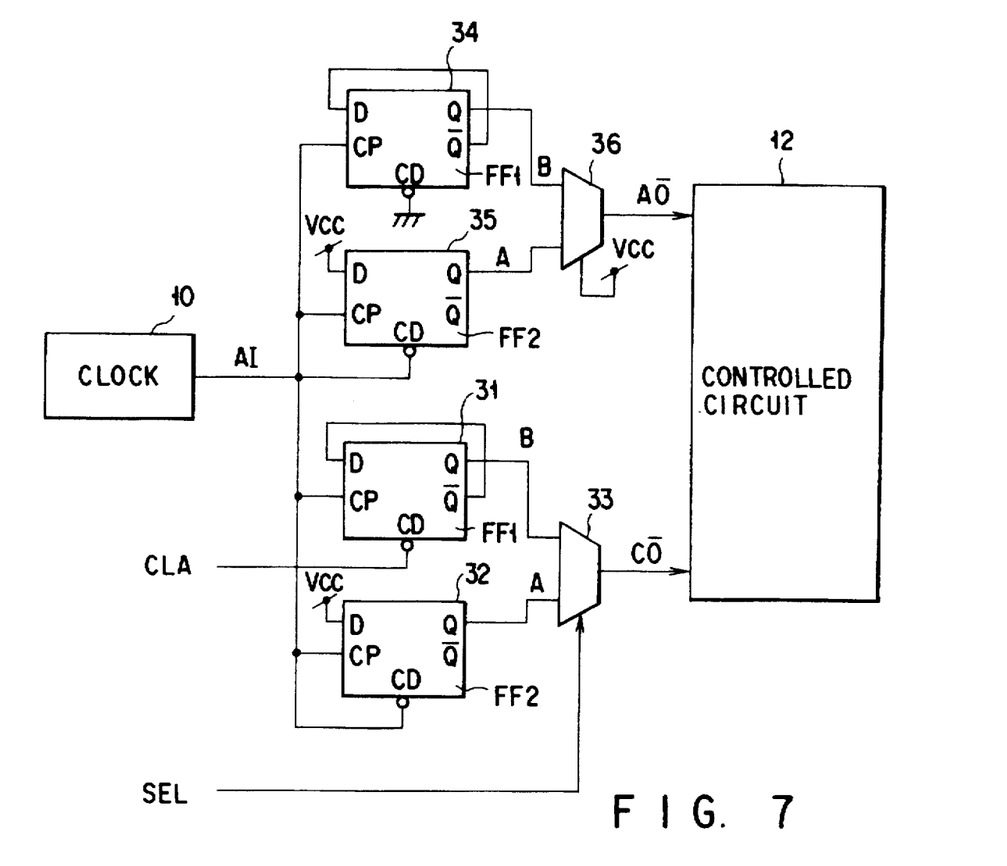
FIG. 7 is a circuit diagram showing a clock signal supplying circuit according to the third embodiment of the present invention.

FIG. 7 shows the third embodiment of the clock signal supplying circuit according to the present invention.

The clock signal supplying circuit shown in FIG. 7 comprises the clock signal generating circuit 10, a first frequency-dividing circuit 31 which is the D-type flip-flop circuit FF1 with the clear signal terminal dividing down the clock signal AI outputted from the clock signal generating circuit 10, a first through circuit 32 which is the D-type flip-flop circuit FF2 with the clear signal terminal causing the clock signal AI except for the frequency division outputted from the clock signal generating circuit 10 to pass through, a first selection circuit 33 in which either the divided frequency clock signal B outputted from the first frequency-dividing circuit 31 or the clock signal A outputted from the first through circuit 32 is selected in accordance with the selection signal SEL so that the selected output CO is supplied to the controlled-circuit 12, a second frequency-dividing circuit 34 which is the D-type flip-flop circuit FF1 with the clear signal terminal dividing down the clock signal AI outputted from the clock signal generating circuit 10, a second through circuit 35 which is the D-type flip-flop circuit FF2 with the clear signal terminal causing the clock signal AI outputted from the clock signal generating circuit 10 except for the frequency division to pass through, and a second selection circuit 36 in which the divided frequency clock signal B outputted from the second frequency-dividing circuit 34 and the clock signal A outputted from the second through circuit 35 are inputted, and the clock signal A outputted from the second through circuit 35 is regularly selected (selected fixedly) so that the selected signal AO is supplied to the controlled-circuit 12.

In the D-type flip-flop circuit FF1 used in the first frequency-dividing circuit 31, the clock signal AI outputted from the clock signal generating circuit 10 is inputted to the clock signal input terminal CP, the clear signal CLA is inputted to the clear signal terminal CD, and inversion-data output terminal/Q is connected to the data input terminal D.

In the D-type flip-flop circuit FF1 used in the second frequency-dividing circuit 34, the clock signal AI outputted from the clock signal generating circuit 10 is inputted to the clock input terminal CP, the clear signal terminal CD is fixed to the "L"-level (the ground potential Vss), and the inversion-data output terminal/Q is connected to the data input terminal D.

Furthermore, in the D-type flip-flop circuit FF2 used in both of the first through circuit 32 and the second through circuit 35, the clock signal AI outputted from the clock signal generating circuit 10 is inputted both to the clock input terminal CP and the clear signal terminal CD, and the data input terminal D is fixed to the "H"-level (the power supply voltage Vcc).

Figure 8:
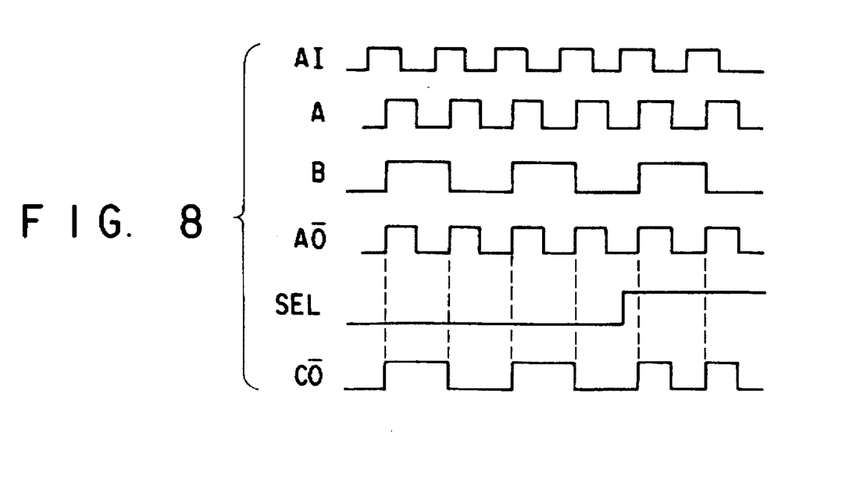
FIG. 8 is a timing-wave-form chart showing one operational example according to the third embodiment of FIG. 7.

The clock signal supplying circuit with the structure of FIG. 7 operates that it causes the corresponding two clock signals through the first signal path and the second signal path from the same clock signal source to supply to the controlled-circuit, as shown in FIG. 8. Under these circumstances, the first through circuit 32 having signal-delay-quantity equivalent to the signal-delay-quantity of the first frequency-dividing circuit 31 in the different signal path branched in regard to the signal path with the frequency-dividing circuit 31 is inserted into the first signal path having the first selection circuit 33, while the second through circuit 35 having signal-delay-quantity equivalent to the signal-delay-quantity of the second frequency-dividing circuit 34 in the different signal path branched in regard to the signal path with the frequency-dividing circuit 34 is inserted into the second signal path having the second selection circuit 36.

This makes it possible to greatly improve clock skew between the clock signal passed through the first signal path and the divided frequency clock signal passed through the second signal path from the same clock signal source.

Figure 9:
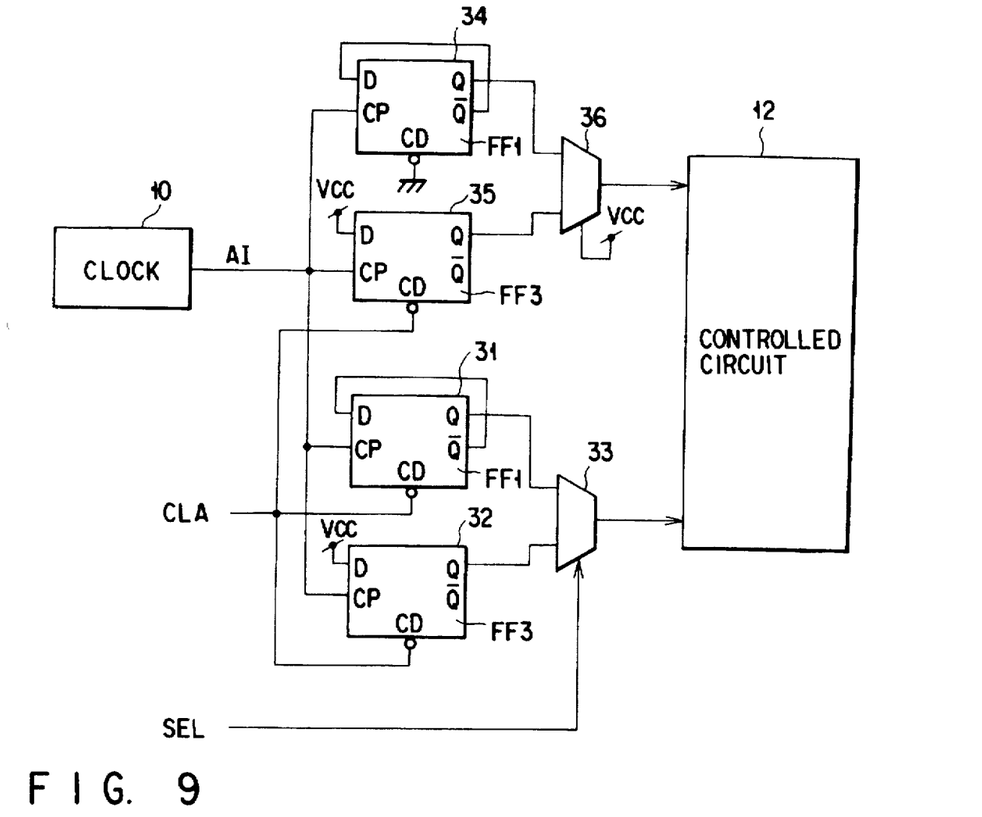
FIG. 9 is a circuit diagram showing a clock signal supplying circuit according to the fourth embodiment of the present invention.

FIG. 9 shows a structure of the fourth embodiment of the clock signal supplying circuit according to the present invention.

The clock signal supplying circuit shown in FIG. 9 is different from the circuit shown in FIG. 7 in that the first and second through circuits 32 and 35 comprise D-type flip flop circuits FF3, not D-type flip-flop circuits FF2. The D-type flip-flop circuits FF3 differ from the D-type flip-flop circuits FF2 in that a clear signal CLA is supplied to the clear signal terminal CD. Since the others are the same as the clock signal supplying circuit of FIG. 7, the detailed description thereof will be omitted, while applying the same symbols as FIG. 7.

Figure 10:
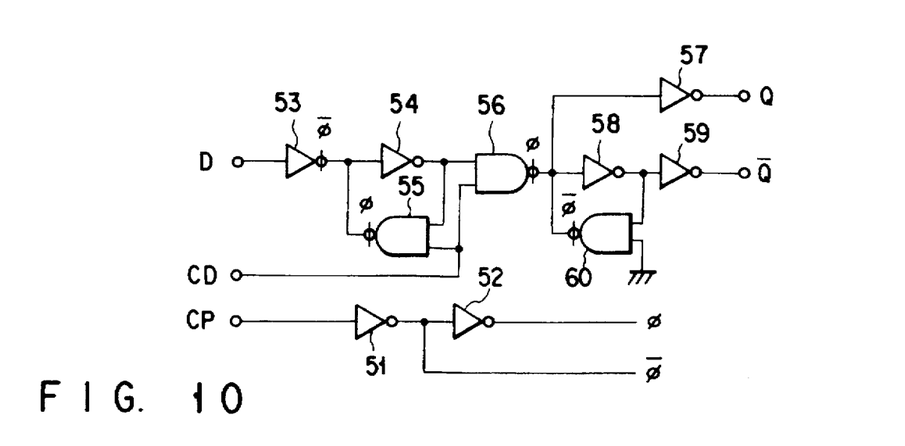
FIG. 10 is a circuit diagram showing a detailed structure of a through circuit used for the fourth embodiment of the present invention.

FIG. 10 shows the detailed internal structure of the D-type flip-flop circuit FF3 used as the through circuit in the fourth embodiment.

In FIG. 10, D is a data input terminal, CD is a clear signal terminal, Q is a data output terminal and /Q is inversion data output terminal.

The complementary clock pulse φ, /φ are generated because the clock signal inputted to the clock input terminal CP is supplied to the two-stage inverter circuits 51, 52. The data signal inputted to the data input terminal D is inputted to the first inverter circuit 54 passed through the clocked inverter circuit 53. The respective output of the first inverter circuit 54 is inputted both to the first input terminal of the first clocked-NAND gate 55 and the first input terminal of the second clocked-NAND gate 56. The clear signal inputted to the clear signal terminal CD is inputted both to the second input terminal of the first clocked-NAND gate 55 and the second input terminal of the second clocked-NAND gate 56.

The connection between the output terminal of the first clocked-NAND gate 55 and the input terminal of the first inverter circuit 54 is of the feedback connection, the first inverter circuit 54 and the first clocked-NAND gate 55 compose the first latch circuit.

Furthermore, the output of the second clocked-NAND gate 56 is outputted from the data output terminal Q by way of the second inverter circuit 57 and is outputted from the inversion-data-output terminal/Q by way of the third inverter circuit 58 and the fourth inverter circuit 59. The output of the third inverter circuit 58 is inputted to the first input terminal of the third clocked-NAND gate 60, and the ground potential Vss is inputted to the second input terminal of the third clocked-NAND gate 60. The second inverter circuit 57 and the third clocked-NAND gate 60 compose the second latch circuit.

The D-type flip-flop circuit FF1 used as a frequency-dividing circuit in each embodiment described above differs from the through circuits FF2 used in the first to third embodiments, only in that the second input terminal of the third clocked-NAND gate 60 is connected to the clear signal terminal CD, not to the ground potential.

Figure 11:
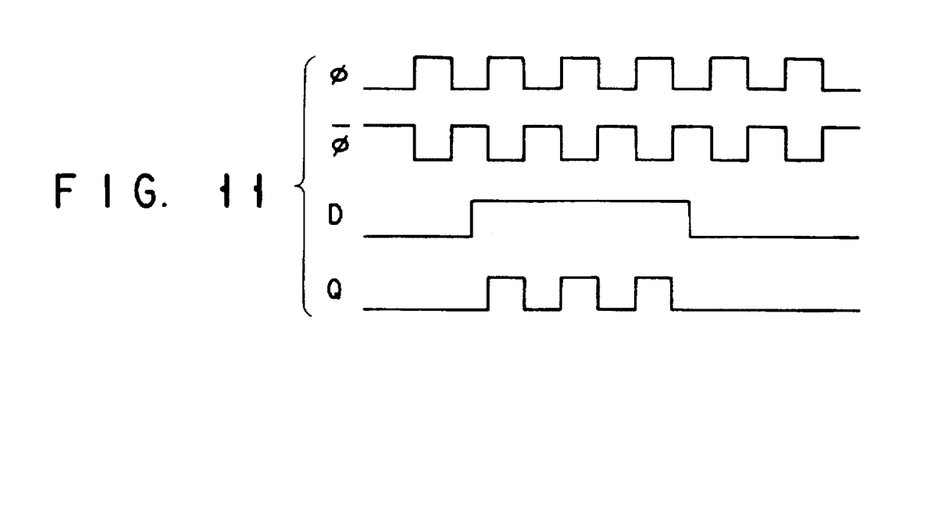
FIG. 11 is a timing-wave-form chart showing one operational example of the through circuit of FIG. 10.

FIG. 11 is a timing-wave-form chart showing one operational example of the through circuit of FIG. 10.

Namely, as shown in FIG. 10, if the clock input terminal CP is separated from the clear signal terminal CD, as shown in FIG. 11, an operation (the operation is the same as T-type flip-flop circuit) in which the output is inverted every clock-input of the clock input terminal CP under the condition that the "H"-level is inputted to the data input terminal D.

In the structure of the clock signal supplying circuit shown in FIG. 9, an operation fundamentally equivalent to the operation of the clock signal supplying circuit shown in FIG. 7 is performed. Furthermore, since it makes possible to voluntarily reset the D-type flip-flop circuit by virtue of the clear signal regardless of the clock signal, the initial level of the signal in each signal path is capable of being made uniform easily.

Figure 12:
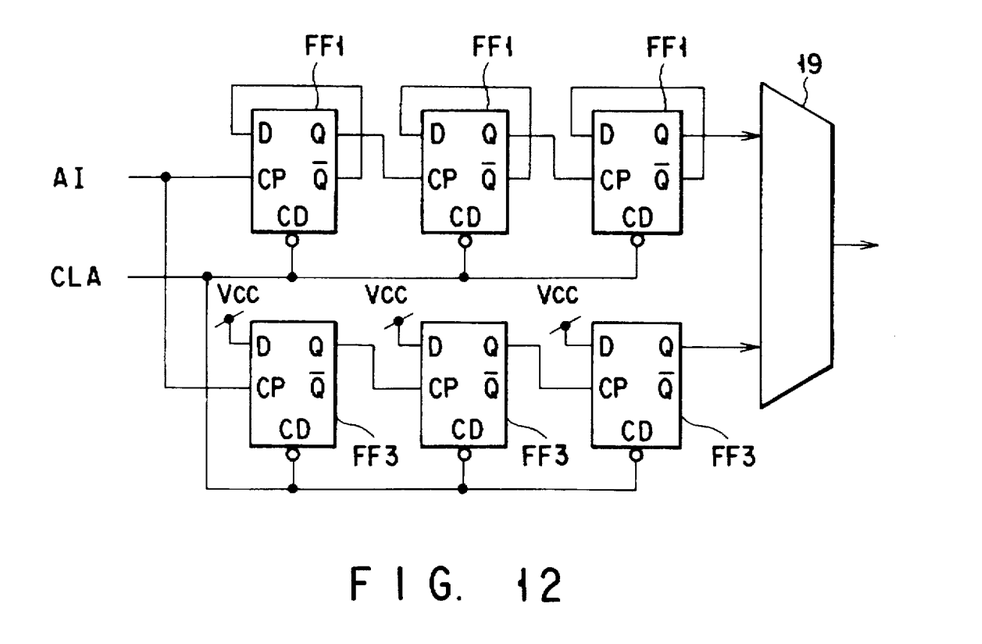
FIG. 12 is a circuit diagram showing one variation-example of each embodiment of the present invention.

FIG. 12 shows a dividing-by-eight frequency-dividing circuit in which the D-type flip-flop circuit FF1 with the clear signal terminal CD is connected thereto in three-stage connection and the through circuit having a signal-delay-quantity corresponding thereto as the frequency-dividing circuit in each above-described embodiment and one variation-example of the through path circuit corresponding thereto.

Furthermore, FIG. 12 shows an example in which the variation-example is applied to for example the frequency-dividing circuit 31 and the through circuit 32 in FIG. 9.

Moreover, the numbers of connection-stage for the D-type flip-flop circuits FF1, FF3 are not limited of three-stages as shown in FIG. 12, it is capable of being connected in necessary numbers of stages in the frequency-dividing circuit.

As described above, according to the present invention, it makes possible to improve the clock skew between the clock signal by way of the path only passing through the signal and the divided frequency clock signal by way of the path including the frequency-dividing circuit and so forth from the same clock signal source.

What is claimed is:

1. A clock signal supplying circuit, comprising:
   a clock signal generating circuit for generating a clock signal;
   a first signal path in which a frequency-dividing circuit for dividing down said clock signal is provided;
   a second signal path having a signal-delay-quantity substantially equivalent to a signal-delay-quantity of the first path and permitting said clock signal to pass through undivided, said second signal path including a delay circuit having a structure substantially equivalent to the frequency dividing circuit; and
   a controlled circuit which receives a signal from the first signal path and a signal from the second signal path, and having an operation controlled by said signals from the first and second signal paths.

2. A clock signal supplying circuit, comprising:
   a clock signal generating circuit for generating a clock signal;
   a frequency-dividing circuit which receives said clock signal, and outputs a first signal with said clock signal divided down;
   a delay circuit having a signal-delay-quantity substantially equivalent to a signal-delay-quantity between input of the clock signal and output of the first signal said frequency-dividing circuit, outputting a second signal after receiving said clock signal, and having a, structure substantially equivalent to the frequency-dividing circuit; and
   a controlled circuit which receives the first signal outputted from said frequency-dividing circuit and the second signal outputted from said delay circuit, and having an operation controlled by the first and second signals.

3. A clock signal supplying circuit according to claim 2, wherein said frequency-dividing circuit includes at least one D-type flip-flop circuit, and said delay circuit includes D-type flip-flop circuit of the same number as said frequency-dividing circuit.

4. A clock signal supplying circuit according to claim 2, further comprising:
   a selection circuit in which either the first signal outputted from said frequency-dividing circuit or the second signal outputted from said delay circuit is selected in accordance with a selection control signal, and the selected signal is supplied to said controlled circuit.

5. A clock signal supplying circuit according to claim 3, wherein each of said D-type flip-flop circuit provided at said frequency-dividing circuit includes a clock input terminal, a data input terminal, a data output terminal for providing said first signal, an inversion-data output terminal and a clear signal terminal for receiving a clear signal, said clock signal being inputted to said clock input terminal, said inversion-data output terminal being connected to said data input terminal, and each of said D-type flip-flop circuit provided at said delay circuit includes a clock input terminal, a data input terminal, a data output terminal for providing said second signal, an inversion-data output terminal, and a clear signal terminal, said clock signal being inputted both to said clock input terminal and said clear signal terminal, a logic signal of "H"-level being inputted to said data input terminal.

6. A clock signal supplying circuit comprising:

a clock signal generating circuit for generating a clock signal;

a first frequency-dividing circuit which receives said clock signal, and outputs a first signal with said clock signal divided down;

a first delay circuit having signal-delay-quantity substantially equivalent to signal-delay-quantity between input signal and output signal of said first frequency-dividing circuit, and outputting a second signal after receiving said clock signal;

a first selection circuit in which either the first signal outputted from said first frequency-dividing circuit or the second signal outputted from said first delay circuit is selected in accordance with a selection control signal, and the selected signal is outputted as a third signal;

a second delay circuit having signal-delay-quantity substantially equivalent to signal-delay-quantity between said clock signal and the output of said first selection circuit, and outputting a fourth signal after receiving said clock signal; and a controlled circuit which receives both of the third signal outputted from said first selection circuit and the fourth signal outputted from said second delay circuit, an operation thereof being controlled by the third and the fourth signals.

7. A clock signal supplying circuit according to claim 6, wherein said first frequency-dividing circuit includes at least one D-type flip-flop circuit, and said first delay circuit includes D-type flip-flop circuit of the same number as said first frequency-dividing circuit.

8. A clock signal supplying circuit according to claim 7, wherein each of said D-type flip-flop circuit provided at said first frequency-dividing circuit includes a clock input terminal, a data input terminal, a data output terminal for providing said first signal, an inversion-data output terminal and a clear signal terminal for receiving a clear signal, said clock signal being inputted to said clock input terminal, said inversion-data output terminal being connected to said data input terminal, and each of said D-type flip-flop circuit provided at said first delay circuit includes a clock input terminal, a data input terminal, a data output terminal for providing said second signal, an inversion-data output terminal, and a clear signal terminal, said clock signal being inputted both to said clock input terminal and said clear signal terminal, a logic signal of "H"-level being inputted to said data input terminal.

9. A clock signal supplying circuit according to claim 6, wherein said second delay circuit includes:

a second frequency-dividing circuit which receives said clock signal, and which has signal-delay-quantity substantially equivalent to signal-delay-quantity between input signal and output signal of said first frequency-dividing circuit, and which outputs a fifth signal after dividing down said clock signal;

a third delay circuit which has signal-delay-quantity substantially equivalent to signal-delay-quantity between input signal and output signal of said first frequency-dividing circuit, and which outputs a sixth signal after receiving said clock signal; and a second selection circuit which is formed equivalently to the first selection circuit, in which either the fifth signal outputted from said second frequency-dividing circuit or the sixth signal outputted from said third delay circuit is selected in accordance with a second selection control signal, and the selected signal is outputted as the fourth signal.

10. A clock signal supplying circuit according to claim 9, wherein the second selection control signal is fixed to a first logic level, and the second selection circuit regularly selects the fifth signal outputted from the second frequency-dividing circuit, outputting as the fourth signal.

11. A clock signal supplying circuit according to claim 9, wherein the second selection control signal is fixed to a second logic level, and the second selection circuit regularly selects the sixth signal outputted from the third delay circuit, outputting as the fourth signal.

12. A clock signal supplying circuit according to claim 9, wherein said second frequency-dividing circuit includes D-type flip-flop circuit of a same number as said first frequency-dividing circuit and said third delay circuit includes D-type flip-flop circuit of a same number as said second frequency-dividing circuit.

13. A clock signal supplying circuit according to claim 12, wherein each of said D-type flip-flop circuit provided at said second frequency-dividing circuit includes a clock input terminal, a data input terminal, a data output terminal for providing said fifth signal, an inversion-data output terminal and a clear signal terminal coupled to ground, said clock signal being inputted to said clock input terminal, said inversion-data output terminal being connected to said data input terminal, and each of said D-type flip-flop circuit provided at said third delay circuit includes a clock input terminal, a data input terminal, a data output terminal for providing said sixth signal, an inversion-data output terminal, and a clear signal terminal, said clock signal being inputted both to said clock input terminal and said clear-signal terminal, a logic signal of "H"-level being inputted to said data input terminal.

14. A clock signal supplying circuit, comprising:

a clock signal generating circuit for generating a clock signal;

a first signal-output circuit, said first signal-output circuit comprising a first frequency-dividing circuit, receiving said clock signal and outputting a first signal with said clock signal divided down, a first delay circuit having signal-delay-quantity substantially equivalent to signal-delay-quantity between input signal and output signal of said first frequency-dividing circuit, and, outputting a second signal after receiving said clock signal, and a first selection circuit in which either said first signal outputted from said first frequency-dividing circuit or said second signal outputted from said first delay circuit is selected in accordance with a first selection control signal, and the selected signal is outputted as a third signal; and at least one second signal-output circuit, said second signal-output circuit comprising a second frequency-dividing circuit which receives said clock signal, and which has a signal-delay-quantity substantially equivalent to the signal-delay-quantity between input signal and output signal of said first frequency-dividing circuit, and which outputs a fourth signal after dividing down said clock signal;

a second delay circuit which has a signal-delay-quantity substantially equivalent to the signal-delay-quantity between input signal and output signal of said first frequency-dividing circuit, and which outputs a fifth signal after receiving said clock signal; and a second selection circuit, in which either said fourth signal outputted from said second frequency-dividing circuit or said fifth signal outputted from said second delay circuit is selected in accordance with a second selection control signal, and the selected signal is outputted as a sixth signal.

15. A clock signal supplying circuit according to claim 14, wherein said first frequency-dividing circuit includes at least one D-type flip-flop circuit and said first delay circuit includes D-type flip-flop circuit of the same number as said first frequency-dividing circuit, said second frequency-dividing circuit includes D-type flip-flop circuit of the same number as said first frequency-dividing circuit, said second delay circuit includes D-type flip-flop circuit of the same number as said first divided frequency circuit.

16. A clock signal supplying circuit according to claim 15, wherein each of said D-type flip-flop circuit provided at said first and second frequency-dividing circuits includes a clock input terminal, a data input terminal, a data output terminal for providing one of said first and fourth signals, an inversion-data output terminal and a clear signal terminal for receiving a clear signal, said clock signal being inputted to said clock input terminal, said inversion-data output terminal being connected to said data input terminal, and each of said D-type flip-flop circuit provided at said first and second delay circuits includes a clock input terminal, a data input terminal, a data output terminal for providing one of said second and fifth signal, an inversion-data output terminal, and a clear signal terminal, said clock signal being inputted both to said clock input terminal and said clear signal terminal, a logic signal of "H"-level being inputted to said data input terminal.

17. A clock signal supplying circuit, comprising:

a clock signal generating circuit for generating a clock signal;

a frequency-dividing circuit having a first D-type flip-flop circuit including a clock input, terminal, a data input terminal, a data output terminal, an inversion-data output terminal, a cleat signal terminal, said clock signal is inputted to said clock input terminal, and both of said inversion-data output terminal and said data input terminal are connected thereto, outputting a first signal from said data output terminal;

a delay circuit having a second D-type flip-flop circuit including a clock input terminal, a data input terminal, a first data output terminal, an inversion-data output terminal, a clear signal terminal, said clock signal is inputted both to said clock input terminal and said clear signal terminal outputting a second signal from said first data output terminal, and a logic signal of "H"-level is inputted to said data input terminal; and a controlled circuit which receives said first signal outputted from said frequency-dividing circuit and said second signal outputted from said delay circuit, an operation thereof being controlled by said first and said second signals.

18. A clock signal supplying circuit, comprising:

a clock signal generating circuit for generating a clock signal;

a frequency-dividing circuit which receives said clock signal and outputs a first signal with said clock signal divided down and includes at least one D-type flip-flop circuit, said D-type flip-flop circuit including a clock input terminal, a data input terminal, a data output terminal for providing said first signal, an inversion-data output terminal, and a clear signal terminal for receiving a clear signal, said clock signal being inputted to said clock input terminal and said inversion-data output terminal being connected to said data input terminal;

a delay circuit having a structure substantially equivalent to the frequency-dividing circuit, including at least one D-type flip-flop circuit and having a signal-delay-quantity substantially equivalent to a signal-delay-quantity between input of the clock signal and output of the first signal said frequency-dividing circuit, said delay circuit outputting a second signal after receiving said clock signal, and said D-type flip-flop circuit including a clock input terminal, a data input terminal, a data output terminal for providing said second signal, an inversion-data output terminal, and a clear signal terminal, with said clock signal being inputted to said clock input terminal and said clear signal terminal, and a logic signal of "H"-level being inputted to said data input terminal; and a controlled circuit which receives the first signal outputted from said frequency-dividing circuit and the second signal outputted from said delay circuit, and having an operation controlled by the first and second signals.

* * * * *

UNITED STATES PATENT AND TRADEMARK OFFICE
CERTIFICATE OF CORRECTION

PATENT NO. : 5,767,720
DATED : June 16, 1998
INVENTOR(S) : Shinichi OSERA et al.

It is certified that error appears in the above-indentified patent and that said Letters Patent is hereby corrected as shown below:

Claim 2, column 8, line 46, after "a", delete ",".

Claim 13, column 10, line 38, before "ground", insert --a--.

Claim 13, column 10, line 46, "clear-" should read --clear--.

Claim 16, column 11, line 42, "signal" should read --signals--.

Claim 17, column 11, line 51, after "clock input", delete ",".

Signed and Sealed this

Twenty-seventh Day of April, 1999

Attest:

Q. TODD DICKINSON

Attesting Officer

Acting Commissioner of Patents and Trademarks